United States Patent
Vester

(10) Patent No.: US 9,910,113 B2
(45) Date of Patent: Mar. 6, 2018

(54) LOCAL COIL FOR A MAGNETIC RESONANCE IMAGING SYSTEM AND MAGNETIC RESONANCE IMAGING SYSTEM

(71) Applicant: Markus Vester, Nürnberg (DE)

(72) Inventor: Markus Vester, Nürnberg (DE)

(73) Assignee: Siemens Aktiengesellschaft, München (DE)

( * ) Notice: Subject to any disclaimer, the term of this patent is extended or adjusted under 35 U.S.C. 154(b) by 1295 days.

(21) Appl. No.: 13/923,308

(22) Filed: Jun. 20, 2013

(65) Prior Publication Data

US 2013/0342198 A1    Dec. 26, 2013

(30) Foreign Application Priority Data

Jun. 21, 2012  (DE) .................. 10 2012 210 507

(51) Int. Cl.
*G01V 3/00* (2006.01)
*G01R 33/36* (2006.01)

(52) U.S. Cl.
CPC ..... *G01R 33/3692* (2013.01); *G01R 33/3621* (2013.01)

(58) Field of Classification Search
CPC .................................. G01R 33/3692
USPC .................................. 324/322, 318
See application file for complete search history.

(56) References Cited

U.S. PATENT DOCUMENTS 7,309,989 B2 * 12/2007 Boskamp ........... G01R 33/3692
324/322
7,403,011 B2 *  7/2008 Burdick, Jr. ..... G01R 33/34007
324/318

(Continued)

FOREIGN PATENT DOCUMENTS

| CN | 201387480 Y | 1/2010 |
|---|---|---|
| DE | 10 2010 019 058 A1 | 11/2011 |
| WO | WO2009081378 A1 | 7/2009 |

OTHER PUBLICATIONS

German Office Action dated Jan. 17, 2013 for corresponding German Patent Application No. DE 10 2012 210 507.7 with English translation.
Chinese Office action for related Chinese Application No. 201231023102lX, dated Oct. 8, 2015, with English Translation.

*Primary Examiner* — Louis Arana
(74) *Attorney, Agent, or Firm* — Lempia Summerfield Katz LLC

(57) ABSTRACT

A local coil for a magnetic resonance imaging system for acquisition of magnetic resonance signals includes a receiving mechanism for wireless transmission of operating energy of the local coil and/or a signal of the magnetic resonance imaging system. The receiving mechanism is configured to take the operating energy and/or the signal from a supply field. A magnetic resonance imaging system is also provided. The magnetic resonance imaging system includes a transmitting mechanism for wireless transmission of operating energy of a local coil and/or a signal of the magnetic resonance imaging system. The transmitting mechanism has a transmission signal generator that is connected to a field source and a field sink. The transmitting mechanism is constructed such that, in operation, the operating energy and/or the signal is transmitted by a supply field that is present as an electrical alternating voltage field between the field source and the field sink.

19 Claims, 5 Drawing Sheets

(56) References Cited

U.S. PATENT DOCUMENTS

| | | | |
|---|---|---|---|
| 9,006,934 B2* | 4/2015 | Kozakai | H03F 1/565 |
| | | | 307/104 |
| 2003/0069051 A1* | 4/2003 | Pretre | H02J 17/00 |
| | | | 455/572 |
| 2003/0206019 A1 | 11/2003 | Boskamp | |
| 2007/0166730 A1 | 7/2007 | Menon et al. | |
| 2012/0031645 A1 | 2/2012 | Tartaglia | |
| 2012/0062230 A1* | 3/2012 | Vaughan, Jr. | G01R 33/3415 |
| | | | 324/318 |

* cited by examiner

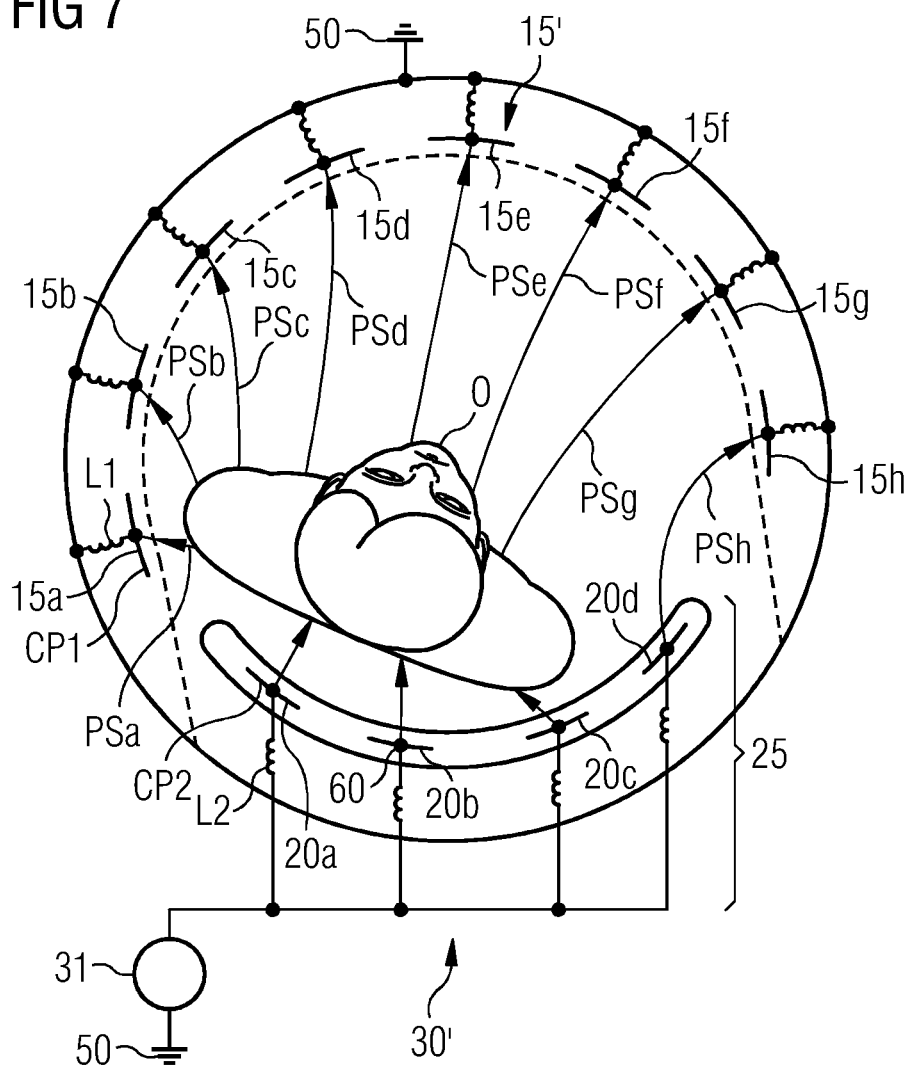

LOCAL COIL FOR A MAGNETIC RESONANCE IMAGING SYSTEM AND MAGNETIC RESONANCE IMAGING SYSTEM

This application claims the benefit of DE 10 2012 210 507.7, filed on Jun. 21, 2012, which is hereby incorporated by reference.

BACKGROUND

The present embodiments relate to a local coil for a magnetic resonance imaging system and a magnetic resonance imaging system, where the local coil or the magnetic resonance imaging system are embodied for the wireless transmission of operating energy or a reference signal.

Imaging systems based on a magnetic resonance imaging method (e.g., using nuclear spins, magnetic resonance tomography scanners) are proven in numerous applications. In this type of image acquisition, a strong static basic magnetic field $B_0$ is used for the initial orientation and homogenization of magnetic dipoles that are to be examined. To determine material properties of an object under investigation to be depicted, the dephasing or relaxation time is determined after a deflection of the magnetization from the initial orientation so that different material relaxation mechanisms or relaxation times may be identified. The deflection may be effected by a number of HF pulses that are matched to the Larmor frequency of the dipoles to be excited. The Larmor frequency is determined by the properties of the material investigated and scaled with the strength of the basic magnetic field $B_0$. For magnetic resonance measurements on biological examination objects, electromagnetic HF pulses with a Larmor frequency of 42.6 MHz and corresponding multiples may be used. This corresponds to the Larmor frequency of proton spins in a basic magnetic field $B_0$ with a strength of 1 T (e.g., the multiplication factor corresponds to the strength of the basic magnetic field $B_0$ in T).

Active implants such as, for example, pacemakers or brain stimulators are, therefore, designed such that the active implants have sufficient immunity to these typical Larmor frequencies for the examination of tissue. This immunity is demonstrated by the manufacturer of the implant so that electromagnetic signals with these frequencies may also be used in a magnetic resonance imaging system for test subjects with an active implant.

Other electromagnetic signals may also be used in a magnetic resonance imaging system. A known method to improve the magnetic resonance imaging is, for example, the use of local coils for magnetic resonance signal acquisition that are arranged in the immediate vicinity of the object under investigation during the magnetic resonance signal acquisition. This has advantages in the signal-to-noise ratio compared to magnetic resonance signal acquisition mechanisms at a greater distance from the object under investigation such as, for example, a body coil.

The cable connections to the local coils are difficult to handle since the test subject may need to be moved during the magnetic resonance imaging sequence in the tomography system, and thus, to provide optimum image acquisition, the cable routing is to be adapted to the local coil.

SUMMARY AND DESCRIPTION

It would be desirable to design the local coils such that the local coils may be operated wirelessly (e.g., so that the magnetic resonance signal acquired is transmitted wirelessly to the magnetic resonance imaging system and so that the local coil may also be supplied with operating energy wirelessly). The local coil may be fixed to an object under investigation without cables having to be adapted in the event of the rearrangement of the object under investigation.

The transmission of the magnetic resonance signal and, for example, the operating energy may also be performed by electromagnetic signals that, due to the magnetic component are able, under certain circumstances, to penetrate the object under investigation or to interact with components of the local coil. Immunity to the frequencies used for the transmission of operating energy is to be generated or "developed" for the local coil in a complex way with the aid of stop filters or other frequency-selective measures. It is problematical that immunity to these frequencies is not checked for implants so that the use of a wirelessly operated local coil for implant carriers is to be carefully considered.

The scope of the present invention is defined solely by the appended claims and is not affected to any degree by the statements within this summary.

The present embodiments may obviate one or more of the drawbacks or limitations in the related art. For example, the drawbacks of the prior art are avoided.

One embodiment of a local coil for a magnetic resonance imaging system has a receiving mechanism for the wireless transmission of operating energy of the local coil and/or of a signal (e.g., a control signal or a reference signal). The reference signal, which may also be referred to as a basic system clock frequency, is a clock signal that corresponds to a basic clock rate of the magnetic resonance imaging system, which serves as general reference time signal in the magnetic resonance imaging system. The majority of the components of the magnetic resonance imaging system are synchronized with the basic system clock frequency (e.g., the components have a fixed phase relationship with the basic system clock frequency or are operated with edge synchronization in the basic system clock frequency). For example, a basic clock rate of the local coil is also synchronized with the basic system clock frequency. The basic clock rate of the magnetic resonance imaging system may be in the region of 10 MHz. In one embodiment, a reference signal with a frequency of 5 MHz is used for the transmission (e.g., the reference signal corresponds to a reference time signal or clock pulse of the magnetic resonance imaging system, which is multiplied or divided by integral factors or integral dividers). In the local coil, reconstruction of the reference time signal and, for example, stabilization of this basic clock rate of the magnetic resonance imaging system may take place via so-called phased locked loops (PLLs) so that, unlike the case with the transmission of operating energy for the transmission of a reference signal, a low transmission power of less than one milliwatt may be provided.

In one embodiment, the receiving mechanism is embodied to take the operating energy and/or the reference signal from a supply field embodied as an electrical alternating voltage field between a field source and a field sink. This provides that, for example, the field sink and the field source are mutually interchanged in a capacitor-like arrangement to generate the supply field. Unlike the case with magnetic alternating fields that are source-free, the field sink and also the field source for electric fields is a real component of the magnetic resonance imaging system. For example, the field source or field sink may be arranged in the wall of a patient tunnel of the magnetic resonance imaging system or in a patient table of the magnetic resonance imaging system. In one embodiment, the supply field is a substantially pure electric field (e.g., with respect to the wavelength and orientation) that may be embodied such that the supply field is hardly able to penetrate a living object under investigation. This, for example, makes it easy to suppress interaction with pacemakers or other active implants, and interaction with other electronic components of the magnetic resonance imaging system may also be minimized by the supply field.

The magnetic resonance imaging system is embodied for the wireless transmission of operating energy to a local coil and/or for the transmission of a signal (e.g., a reference signal) to a local coil. The magnetic resonance imaging system has a transmitting mechanism with a signal generator that is connected to a field source and a field sink. The connection may be both direct and indirect (e.g., further components of the magnetic resonance imaging system may be arranged between the transmission signal generator and the field source or the field sink). The transmitting mechanism is constructed such that, in operation, the operating energy and/or the signal described in the introduction (e.g., a reference signal) is transmitted by a supply field that is present as an electrical alternating voltage field between a field source and a field sink that are arranged in the region of the magnetic resonance imaging system. The transmission of the operating energy takes place such that a small capacitor that is assigned to the receiving mechanism of the local coil (e.g., an antenna) is introduced into a large capacitor (e.g., the plates of which may be formed by the bore wall and the patient table and which is assigned to the transmitting mechanism). The polarity or voltage of the plates of the "large" capacitor is alternately inverted, or prespecified voltages are applied to the components representing the field sink or field source so that the field direction or the direction of field lines of the electrical supply field is alternately reversed, and electric influence thus causes an alternating current to be injected into the "small" capacitor. A corresponding supply field may be configured such that the interaction of the supply field with the object under investigation is minimal (e.g., a SAR value that is described in detail below may be adhered to).

In one embodiment of a method for the transmission of operating energy and/or of a signal (e.g., a reference signal) using a supply field to a local coil of a magnetic resonance imaging system, the supply field is switched as electrical alternating voltage field between a field source and a field sink of the magnetic resonance imaging system, and the operating energy of the local coil and/or of the described signal or reference signal is taken from the supply field. This provides that at least parts of the operating energy and/or of a signal or reference signal (e.g., the entire operating energy or the signal) are taken from the supply field.

Advantageous embodiments and developments of the may be derived from the following description. The description relating to one category may also be further developed analogously to the description of another category.

One embodiment relates to a local coil with an antenna that is embodied to generate a current flow due to the electric potential difference of the supply field in the region of the local coil. This provides that the antenna forms a capacitor-like arrangement in the supply field. A "small capacitor," the antenna, is introduced in a "large capacitor" between the field source and the field sink. The receiving mechanism (e.g., the antenna including a rectifier and additional components) is embodied such that operating energy of the local coil and/or a signal (e.g., a reference signal) is taken from the current flow. The extension of the antenna may be selected much lower than the wavelength of the supply field. This, for example, facilitates an advantageous integration of the receiving mechanism in the local coil.

This also makes it possible for the wavelength of the supply field to be selected such that penetration of the object under investigation may be avoided to a large extent. For example, a low-frequency supply field may be used. "Low-frequency" provides that dimensions of the patient are much smaller than the wavelength assigned to the frequency. Attention may be paid to the dimensions of the patient in the direction of the electric field or in the direction of the field lines of the supply field. For example, the frequency of the supply field may be less than 50 MHz.

In one embodiment, the antenna, which, for example, is constructed in several parts from a plurality of antenna elements, includes a capacitor-like arrangement with a substantially flat first electrode or capacitor-electrode. "Substantially flat" provides that the first electrode may be circumscribed in a flat cuboid, where each of the cuboid sides is in contact with the first electrode.

The antenna also has a second electrode or capacitor-electrode. The first electrode and the second electrode are arranged spatially apart from each other. In this case, "spatially apart" may be interpreted as providing that the first electrode and the second electrode are not connected directly to each other, but if appropriate (e.g., for current extraction), indirectly. The first electrode may (e.g., similarly to an end capacitor) provide an additional electrical capacitance (e.g., a charge carrier reservoir) and, together with the second electrode, which serves as a counter-electrode or "counter-balance", contribute to the electrical extension of the antenna in the event of resonance. The first electrode may, for example, be embodied as a star or open ring. The embodiments selected for the first electrode may be transparent to magnetic resonance signals. In other words, the first electrode and, for example, also the second electrode do not have any enclosed structures such as, for example, enclosed rings, extended coherent surfaces or the like. The electrical extension of the antenna enables the power extraction to be increased with an unchanged spacing of the two electrodes between each other. In addition, this enables the choice of the frequency of the supply field to be optimized with respect to a SAR value and/or the susceptibility to interference of implants.

The power that may be taken from the supply field is proportional to the product of the electric field strength and the spacing of the two (capacitor) electrodes. In one embodiment, when the local coil is arranged as prescribed in the supply field, the first electrode and the second electrode are substantially spaced apart in the direction of the supply field (e.g., in the direction of the electric field lines of the supply field). The spacing (e.g., the shortest connection) specifies a "field axis." In one embodiment, during operation as prescribed of the local coil, the field axis extends substantially transversely to the closest surface of the local coil facing the object under investigation. The field axis may, for example, adopt an angle of between 45° and 135° to the surface of the local coil or to the closest surface of the object under investigation. This arrangement may be used to provide optimum energy extraction from the supply field.

To embody the electrical supply fields, a field sink (or field source) may, for example, be formed by the surface of the patient tunnel or may be arranged in the region of the surface of the patient tunnel.

The electric field lines stand almost perpendicularly on a surface of the object under investigation, because the object under investigation, which includes human tissue, is a good conductor compared to air.

The patient as a whole has a relatively high capacitance to the underlying bed. If an alternating voltage is applied to the bed, this enables the surface of the patient to function as a source or sink of radial electric fields that close toward the conductive surfaces applied to the wall of the patient tunnel (e.g., formed by the whole body antenna and/or the radio-frequency screen, which, for this purpose, may also be electrically connected).

For example, the antenna may be embodied substantially flat to receive the supply field (e.g., the antenna may, for example, be inscribed in a flat cuboid, where each side of the cuboid is in contact with the antenna). For example, the shortest connection between the first electrode and the second electrode is thus shorter than the lateral extension of the antenna transverse to this connection direction. Virtually any wavelength may be selected for the supply field, which is larger than the spacing between the first electrode and the second electrode. In one embodiment, relatively low-frequency supply fields may also be selected, without the spacing between the first electrode and the second electrode having to be selected so large that the local coil is difficult to handle.

For example, the first electrode and/or the second electrode may each be arranged on a surface parallel to the closest surface of the object under investigation. In one embodiment, the first electrode may be arranged laminated in a film on this surface or integrated in the local coil in some other way. The receiving mechanism has virtually no additional space requirement in a direction transverse to the object under investigation so that simple handling of the local coil may be provided.

In one embodiment, the antenna has a plurality of antenna elements. In operation, the local coil magnetic resonance signals are acquired with the aid of one of the antenna elements. For example, the magnetic resonance receiving coil provided for the acquisition of magnetic resonance signals may serve as an antenna counterbalance. In this case, therefore, the magnetic resonance receiving coil at least partially forms the second electrode and serves as an antenna counter-electrode.

For example, the receiving mechanism may include a plurality of antennas that are also embodied for energy transmission and/or the transmission of a signal or reference signal. A substantially flat first electrode may be used jointly for a plurality of the antennas so that in this way a particularly efficient construction for taking energy from the supply field is achieved. This does not exclude the possibility of this or a similar construction also being used for the transmission of a signal (e.g., a reference signal).

In one embodiment, the antenna is embodied for the transmission of a reference signal such that the received reference signal has virtually no phase offset with respect to the transmitted reference signal or that there is a simple to determine (e.g., known) phase difference present (e.g., 90° with respect to the transmitted reference signal).

This may, for example, also be achieved with the aid of an impedance-matching mechanism of the receiving mechanism. An impedance-matching mechanism may also be used to optimize the extraction of energy from the supply field. In the case of local coils supplied inductively with operating energy, the contribution of secondary magnetic fields emitted by the receiving mechanism to the heating of the patient is to be taken into account. This provides that the extractable current may not be fully utilized. In the case of capacitive transmission, the counterbalances may be shaped such that the counterbalances keep the secondary electric fields emitted by the receiving antennas remote from the patient. This enables the antenna to be adapted to the input resistance of the energy supply network of the local coil such that all the available power may be delivered to the energy supply network.

The impedance-matching mechanism may, for example, include an oscillating circuit that optimizes the power extraction from the supply field, for example, so that an analog-digital converter may be operated to convert the analog magnetic resonance signals into signals that may be processed digitally. It is advantageous for the reception of a reference signal to embody the impedance-matching mechanism such that capacitive effects are negligible, or a known phase displacement at a signal output (e.g., an energy interface or a reference signal interface) with respect to the transmitted supply field is achieved.

The supply field is to penetrate the patient or test subject (hereinafter only "patient") to the smallest degree possible and make only a small contribution to the overall permitted patient heating. These parameters are, for example, described by the SAR value. This describes the amount of energy of an incident energy field that is absorbed in a certain part of a patient's body and may be calculated in a known way (e.g., from a field strength in the tissue, a current density in the tissue or a temperature rise in the tissue).

In one embodiment, a field electrode that, in operation, alternately forms the field source or the field sink, is arranged in the region of a patient tunnel of the magnetic resonance imaging system (e.g., in the region of the surface of a patient tunnel of the magnetic resonance imaging system facing the patient). In this case, the expression "in the region" provides that the field electrode may be arranged in or on the patient tunnel or the surface thereof and also adjacent to the patient tunnel or the surface thereof. The field electrode or the surface of the patient tunnel may be equipped with insulation or a cover or coated so that a direct contact with the field electrode is not possible. A further electrode, which, during the operation of the magnetic resonance imaging system, alternately forms the field sink or field source, is arranged in the region of a patient table (e.g., in or on a patient table). "In the region of" may be interpreted with reference to the patient table as described above. For example, the arrangement may be such that the field source or field sink appears to be localized at the prescribed location of the object under investigation. For example, this may be achieved in that the further electrode is integrated in the region of the patient table (e.g., in the patient table or a spine coil or another coil in or on the patient table). The object under investigation is used to modulate the field generation so that a virtual punctiform source appears to be localized in the patient. The patient thus forms a center from which the field lines of the electric field appear to emerge. The field lines extend radially outward toward the surface of the patient tunnel facing the patient. The field sink and the field source may also be embodied such that the field sink and the field source are transparent to magnetic resonance signals or magnetic fields at the Larmor frequency.

The supply field, which is purely based on electric fields, causes a current density to be injected in the region of the object under investigation. This current density varies in dependence on the position of the object under investigation in the electric field (e.g., in the case of radial injection of the supply field in dependence on the distance from field sink or field source).

In one embodiment, therefore, the magnetic resonance imaging system is equipped with a transmitting mechanism for the wireless transmission of operating energy to a local coil and/or of a signal (e.g., a reference signal) of the magnetic resonance imaging system, which is embodied to vary (e.g., to regulate or control) a transmission power, a transmission field strength, a transmission voltage and/or a transmission current in dependence on the spatial position of the object under investigation. The injected current density may thus be maintained independently of the position of the object under investigation so that penetration of the supply field in the object under investigation may be effectively controlled and limited. This advantage may, for example, also be achieved in another magnetic resonance imaging system in that the transmitting mechanism is embodied to vary a transmission power, a transmission current, a transmission voltage and/or a transmission field strength in dependence on the position of an object under investigation, where the transmitting mechanism does not have to be embodied with a supply field in the form of an electrical alternating voltage field. The transmitting mechanism may, for example, work inductively.

In one embodiment, the field source and/or the field sink include a plurality of electrode segments that are wired such that the field source and/or the field sink may be adjusted for the transmission of the supply field with an individual segment field strength.

For example, the electrode segments may be wired such that a segment-transmission current, a segment-transmission voltage and/or a segment-transmission power may be adjusted individually. In one embodiment, this takes place with the aid of a tunable LC circuit. The tuning of the LC circuit is performed by acquiring the position of the object under investigation. In one embodiment, the LC circuit is embodied as a tunable reactive impedance for alternating currents.

In exemplary embodiment, the reactive impedance is achieved by a LC circuit that is arranged between an electrode segment arranged in the region of the patient tunnel (e.g., the surface of the patient tunnel facing the patient) and an electrode segment arranged in the region of the patient table. An electrode segment arranged in the patient table and an electrode segment arranged in the bore wall thus in each case together form a capacitor, the capacitance of which is varied by the position of the object under investigation. The resonance frequency of the LC circuit formed with the aid of the electrode segments is thus changed by the position of the object under investigation, and the reactive impedance is thus changed with respect to an alternating current. The strength of this alternating current may be used to control an individual segment field strength, an individual segment-transmission current and/or a segment-transmission voltage. For example, the tuning of the reactive impedance of the resonance circuit may take place such that the resonance condition is fulfilled if the patient is infinitely remote (e.g., if no patient is located in a measuring chamber of the magnetic resonance imaging system). If the patient approaches an electrode segment, the resonance circuit is detuned, and thus, the impedance is increased. Automatically, this may require the regulation of the transmission power or the transmission voltage (e.g., a direct reduction of the transmission current with the aid of the reactive impedance).

In one development of the method, the transmission field strength, the transmission power, the transmission voltage and/or the transmission current of a transmitting mechanism may be varied in dependence on the position of the object under investigation in the magnetic resonance imaging system.

In this development, therefore, the magnetic resonance imaging system may include a capacitor that is tunable with the aid of the position of the object under investigation in the magnetic resonance imaging system, where an electrode of the capacitor substantially corresponds to the field source, and a second electrode of the capacitor substantially corresponds to the field sink.

BRIEF DESCRIPTION OF THE DRAWINGS

The same components in the different figures are designated by identical reference numbers.

FIG. 7 shows an example of an automatic adjustment of the transmission power of the supply field in dependence on the position of the object under investigation.

DETAILED DESCRIPTION

Figure 1:
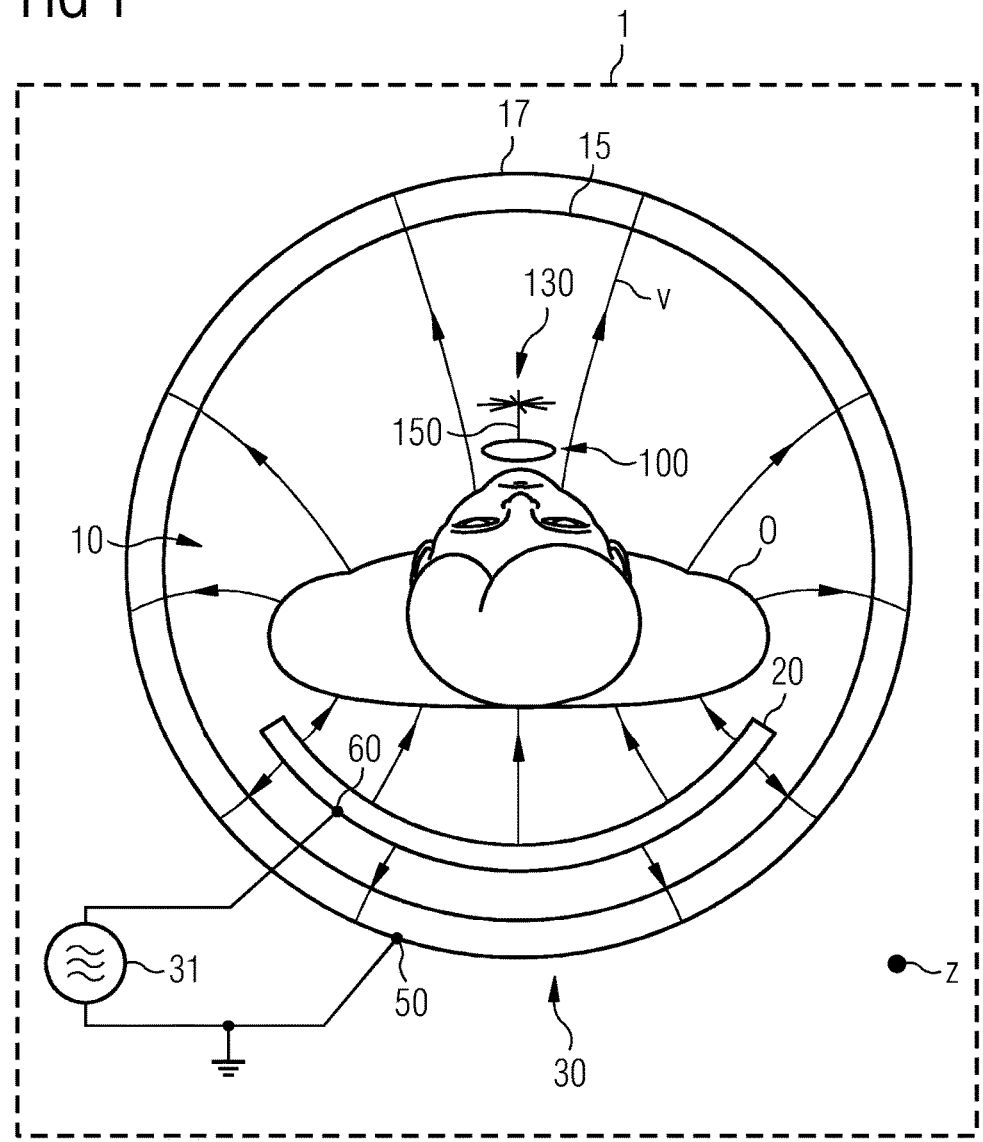
FIG. 1 shows an exemplary embodiment of a magnetic resonance imaging system and an exemplary embodiment of a local coil.
Figure 3:
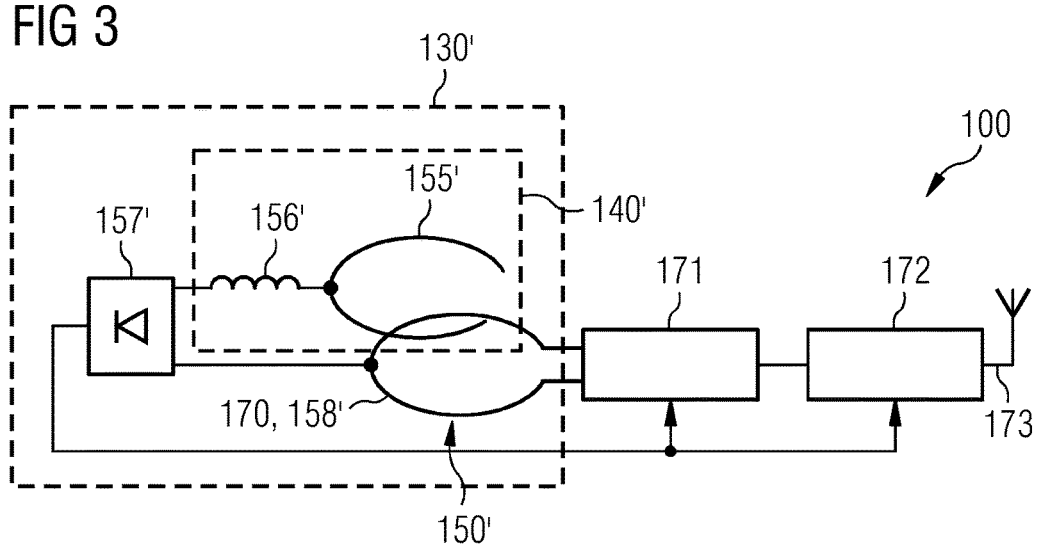
FIG. 3 shows a further exemplary embodiment of a local coil, which has an antenna for the transmission of operating energy, with antenna elements that are also used for the reception or generation of magnetic resonance signals.
Figure 4:
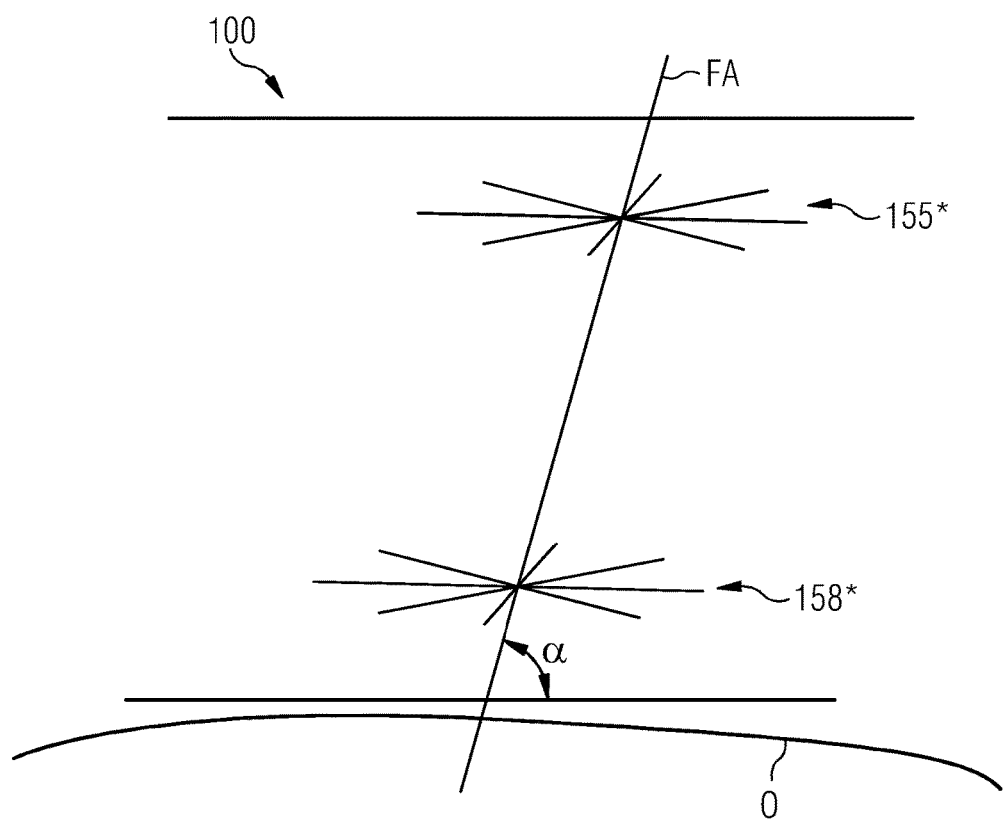
FIG. 4 shows a schematic, sectional representation of one embodiment of a local coil with antenna elements of an antenna for operating energy transmission.
Figure 5:
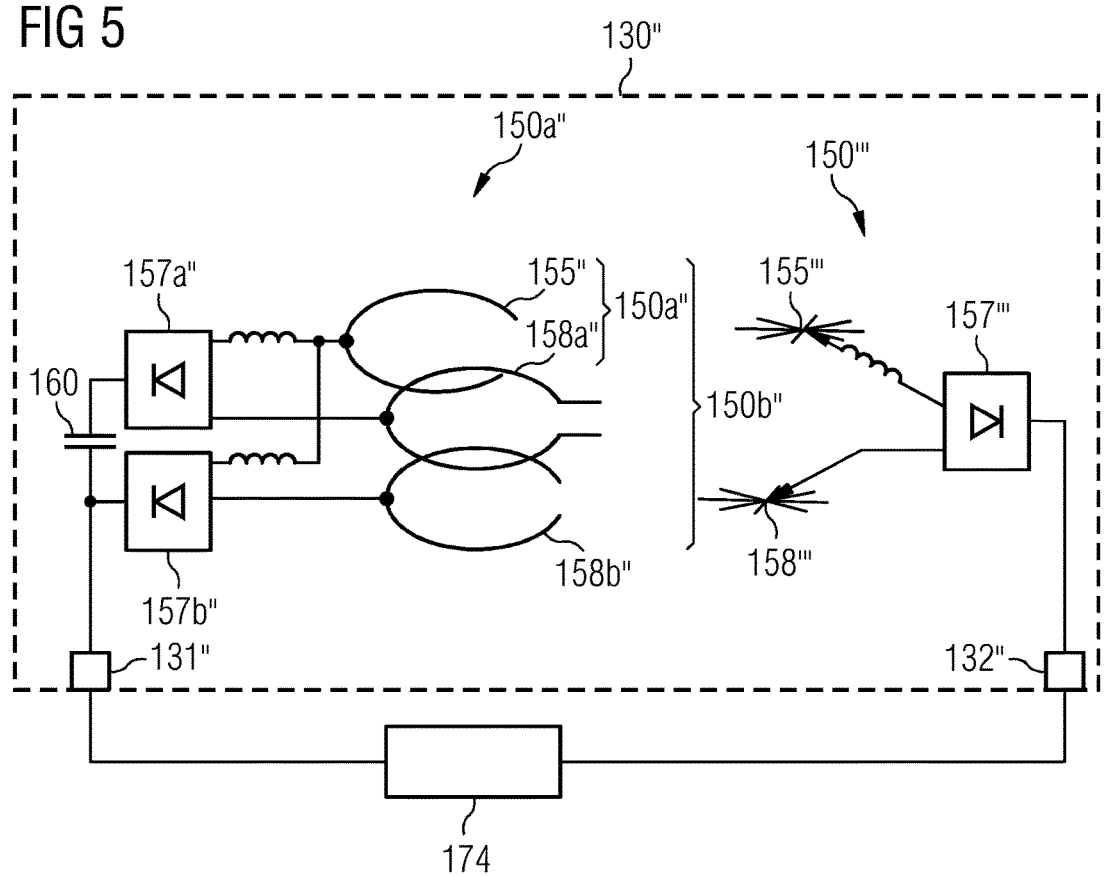
FIG. 5 shows one embodiment of a receiving mechanism for operating energy transmission and for the transmission of a reference signal with a plurality of antennas, which partially have common antenna elements.

FIG. 1 is a simple block diagram of a magnetic resonance system 1 with a local coil 100 that, for example, as described in more detail with respect to FIGS. 3 to 5, may be further developed. The core of the magnetic resonance system 1 is a commercially available tomograph (e.g., a scanner), in which an object under investigation O is positioned on a patient table 20 or a bed in a cylindrical measuring chamber or patient tunnel 10 (e.g., a bore).

The magnetic resonance system 1 may also have the components described below, some of which are not shown for purposes of clarity.

Inside the tomograph, a fixed whole-body antenna arrangement, embodied, for example, as a birdcage antenna, for the emission of magnetic resonance excitation signals or optionally also for the reception of magnetic resonance signals is provided.

As FIG. 1 shows, in operation, a local coil 100, for example, is provided in the bore 10 of the tomograph of the magnetic resonance system 1. The local coil 100 is connected wirelessly to a transmission signal receiving assembly of the magnetic resonance system 1, which may be implemented as part of a raw data acquisition interface in an operation control mechanism (not shown) of the magnetic resonance system 1.

Part of this operation control mechanism or raw data acquisition interface may also be an MR signal processing mechanism. The system is optionally scalable (e.g., a corresponding embodiment of the local coil enables an optional number of physical inputs of the MR-signal processing mechanism to be operated).

The operation control mechanism may control the tomograph. For example, a terminal (or operator console) is connected to the operation control mechanism by a terminal interface, via which an operator may operate the operation control mechanism and hence the tomograph.

The operation control mechanism may be connected by a tomograph control interface to the tomograph in order to control the different components of the tomograph such as, for example, a basic field magnet, a gradient system, the permanently installed radio-frequency transmission system with the whole-body antenna arrangement, and the patient table 20 in a suitable manner.

The tomograph-control interface may be used to output suitable control commands to the tomograph, for example, via a sequence control unit on the basis of scan protocols to enable the desired pulse sequences (e.g., the radio-frequency pulses and gradient pulses for the (not shown) gradient coils to generate the desired magnetic field gradients) to be emitted.

The operation control mechanism may in addition also have a memory, in which, for example, generated image data may be stored and measuring protocols may be stored.

The raw data acquisition interface, which, for example, as described above, has the transmission signal receiving assembly, is used to acquire the raw data (e.g., the received MR incoming signals). The received signals are further processed in the MR signal processing mechanism and supplied to an image reconstruction unit that generates the desired magnetic resonance image data therefrom in the usual way. The data may, for example, be stored in the memory or at least partially output on the terminal or transmitted via the communication network to other components such as diagnostic stations or bulk storage devices.

Both the operation control mechanism and the terminal may also be integral components of the tomograph. In addition, the entire magnetic resonance system 1 also has all the other usual components or features of a system of this kind, but, as already mentioned, these are not shown in FIG. 1 for reasons of clarity.

Since the local coil 100 in the exemplary embodiment is to communicate wirelessly with the operation control mechanism (also not shown), also connected to the tomograph-control interface is an instruction-transmitting mechanism that wirelessly transmits instructions or control signals to the local coil 100.

Also connected to the tomograph control interface is a transmitting mechanism 30 that wirelessly transmits energy to an antenna 150 of the local coil 100 in order to supply the local coil 100 with operating energy and optionally further signals (e.g., a reference signal). The received energy may, for example, be further routed to a local coil control mechanism (not shown) in the local coil 100 or also to other local coils. A plurality of local coils may also be operated in parallel with the aid of an individual local coil control mechanism.

In one embodiment, the energy transmission to the local coil takes place with a receiving mechanism 130 with a capacitive antenna 150 that is in resonance with the supply field V. Since the antenna 150 is used to receive energy and/or signals for the local coil 100, the antenna 150 may also be designated an energy receiving antenna or reference signal and/or control signal receiving antenna. In one embodiment, the energy transmission does not take place via a magnetic radio-frequency field, but via an electrical radio-frequency field that, for example, extends radially between the patient table 20 or the object under investigation O and the surface of the patient tunnel 15 or the internal wall of the magnetic resonance tomograph 1 (e.g., the bore wall). For example, the frequency of the supply field V may be different from the magnetic resonance frequency for the excitation of nuclear spins and may be lower than this. For example, over 20 cm between the patient bed 20 and the radio-frequency shield 17 of the body coil, an electrical supply field, of, for example, the strength 1 kV/m may be generated in that an alternating voltage of, for example, 200 V is applied between the patient bed 20 and the radio-frequency shield 17. The shield 17 together with the body coil may, for example, be connected to a ground potential, and the aforementioned voltage with respect to the ground potential may be fed into a field sink 60 integrated in the bed 20. The in-feeding is performed with a transmission signal generator 31 that generates an electrical alternating field between a field source 50 connected to the ground potential, and a field sink 60. In the following, for purposes of easier legibility, the electrode, which is installed in the region of the bore 10 or the bore wall 15, is designated a field source 50, and the electrode in the region of the table is designated as a field sink 60 even when, due to the alternating field, the function of the field sink or field source alternates.

In the exemplary embodiment, the field sink 60 is formed by a wire net inserted in the bed 20. The wire net is, for example, embodied such that the wire net is transparent to magnetic resonance signals or magnetic fields at Larmor frequency that may, for example, be achieved by a reticular tree structure with no enclosed meshes. The net may, for example, be installed in the bed itself, in a mat lying on the bed or in a spine coil lying on or in the table. The field sink 60 may thus be arranged in different ways in the region of the patient table 20. A radial electrical supply field V forms the field sink 60 arranged in this way and the RF shield 17 serving as a field source 50. In this case, the field sink 60 is located within a cylindrical patient tunnel 10, the longitudinal axis of which is aligned substantially parallel to the basic magnetic field in the z-direction. In the exemplary embodiment, together with the transmission signal generator 31, the field source 50 and the field sink 60 form the transmitting mechanism 30 for the supply field V. Unlike the case in the exemplary embodiment shown, the field source 50 does not, for example, have to be connected to a ground potential, Instead, a reference potential defined with respect to the field sink 60 may be available for the field source 50.

MR-signals received from the local coil 100 are transferred by the local coil control mechanism in prepared form (e.g., in digitized form) as MR data to a magnetic resonance data transmitter, from which the MR-signals are sent via data antenna to a receiving antenna of the magnetic resonance system 1. The MR data received by the receiving antenna is further processed as described above.

The local coil 100 may also be a local coil 100 for the transmission of HF pulses to the object under investigation or a local coil 100 with a combination of the functionalities cited. The local coil 100 is, for example, to be provided with switching components in order to change the local coil 100 from a wireless receiving mode to a wireless transmitting mode.

In one embodiment, an instruction-receiving mechanism may be connected to the local coil 100 to receive wirelessly transmitted instructions. The instructions are, for example, also forwarded to the local coil control mechanism.

Figure 2:
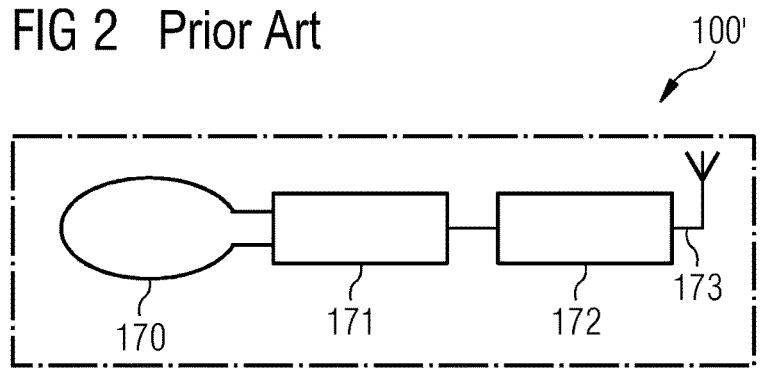
FIG. 2 shows an exemplary embodiment of a local coil according to the prior art.

FIG. 2 shows a conventional local coil 100' according to the prior art. The local coil 100' has, for example, energy supply mechanisms (also not shown) and is embodied for the wireless transmission of magnetic resonance data using a data antenna 173. The magnetic resonance data is acquired by a magnetic resonance receiving coil 170 on or adjacent the object under investigation, forwarded to a magnetic resonance receiver 171, and processed correspondingly (e.g., digitized and sent by a magnetic resonance transmitter 172 via the data antenna 173 to a receiving mechanism of the imaging system).

Unlike a conventional imaging system, with one embodiment of the MR imaging system 1, the supply field V formed as a radial electrical alternating field may pick up the energy in the case of an "anterior" local coil 100 lying on top and on the side of the patient with short "capacitive antennas" 150 pointing radially away from the patient. The effect thereof may be improved by a substantially flat electrode, which is indicated in FIG. 1 as a wire star.

FIG. 3 shows an exemplary embodiment of a corresponding local coil 100 in more detail. In addition to the components already described with reference to FIG. 2, such as the magnetic resonance receiving coil 170, the magnetic resonance receiver 171, the magnetic resonance data transmitter 172 and the data antenna 173, the local coil 100 has a receiving mechanism 130' that is embodied to take the operating energy and/or also the reference signal described in the introduction from the supply field V. For example, the receiving mechanism 130' has a capacitive antenna 150' with a substantially flat first electrode 155'. This is arranged as a continuous ring at a distance (e.g., the antenna height) of, for example, 2 cm above a second electrode 158' of the capacitive antenna 150'. The capacitance of the antenna 150' is supplemented by an oscillating circuit coil 156' in order to bring the antenna 150' in resonance with the alternating voltage frequency of the supply field. Power is output from this oscillating circuit to a rectifier 157' that is then able to supply local coil electronics such as, for example, the magnetic resonance receiver 171 and the magnetic resonance data transmitter 172, or, for example, an analog-digital converter for the conversion of magnetic resonance signals into digital transmission signals that are emitted via the data antenna 173.

As also shown in FIG. 3, the second electrode 158', which simultaneously serves as a magnetic resonance receiving coil 170, is also connected to the rectifier 157' so that the antenna 150' has the components of a first electrode 155', an oscillating circuit coil 156', a rectifier 157' and a second electrode 158'. The voltage difference picked up from the supply field between the first electrode 155' and second electrode 158' generates a current flow (e.g., an alternating current) that is rectified by the rectifier 157'.

The oscillating circuit with the oscillating circuit coil 156' may, for example, simultaneously be understood as an impedance-matching mechanism 140'. It is advantageous to select the alternating current resistance of the antenna 150' so that the alternating current resistance substantially corresponds to the alternating current resistance of a power-supply input of the components of the local coil 100 that are to be supplied with the energy taken from the supply field. For example, with an antenna height of 2 cm above the magnetic resonance receiving coil 170, a voltage of 20 V may be taken from the supply field V. The internal resistance of a first electrode with 5 pF capacitance, with a frequency of the supply field of 5 MHz, is approximately 6.4 kOhm. This may be reduced by the series-switched oscillating circuit coil 156', which, for example, has an inductance of L=200 µH, with a quality of Q=100, to 64 Ohm. This makes available, for example, an effective power of 1.5 Watt at the rectifier.

For posterior coils (e.g., spine coils) attached close to the rear of the object under investigation, which are in mechanical contact with the bed, wireless signal transmission or energy supply may not be necessary.

However, the possibility that once again a voltage is picked up from the coupling capacitance between the bed and the patient may not be excluded. In one embodiment, a spine coil arranged under the bed is operated in the way described above for the anterior coils with the aid of the supply field.

FIG. 4 shows a part of one embodiment of a local coil 100 with another capacitive antenna. Only a first electrode 155* and a second electrode 158* are indicated schematically. The further components of the corresponding capacitive antenna having the electrodes 155*, 158* are not shown in this exemplary embodiment. The first electrode 155* is embodied as a flat wire star as is the second electrode 158*. This embodiment provides transparency to magnetic resonance signals or inductively transmitted signals so that the capacitive antenna does not impede the reception of magnetic resonance signals or even other inductively transmitted signals such as, for example, control signals. The spatial distance (e.g., the shortest connection between the first electrode 155* and second electrode 158*) defines a field axis FA. If the field axis FA extends substantially in the direction of the field lines of the supply field, energy may be taken from the supply field in an optimal manner. The energy substantially corresponds to the difference of the field strength of the supply field between the first electrode 155* and the second electrode 158* multiplied by the distance between the two electrodes. It is therefore advantageous for the field axis FA to enclose an angle α in the range between 45° and 135° with a surface of the local coil facing the patient O, so that the greatest possible potential difference of the supply field is present between the electrodes 155* and 158* of the antenna, since the alignment of the field axis FA substantially corresponds to the alignment of the field lines of the supply field in the region of the antenna.

The first electrode 155* and the second electrode 158* modify the capacitance of the antenna, similar to an end capacitor with assigned counterbalance (e.g., counterweight) or assigned counter-electrode. It is thus advantageous for the first electrode 155* and the second electrode 158* to make a substantially capacitive contribution to the overall capacitance of the antenna, which enables the antenna to be tuned to the frequency of the supply field.

FIG. 5 shows a development of a receiving mechanism 130" that is arranged in or on a local coil. In addition to antennas 150a" and 150b", the receiving mechanism 130" has an antenna 150'" that is embodied to receive the reference signal of the magnetic resonance imaging system. The reference signal is also taken from the supply field and transmitted to a magnetic resonance local coil 174 that for example, may have the components of the magnetic resonance receiving coil, the magnetic resonance receiver, the magnetic resonance data transmitter and the data antenna described with respect to FIG. 2. This may, for example, take place with the aid of a reference signal interface 132' of the receiving mechanism 130".

In this exemplary embodiment, the supply field is embodied as an electrical alternating field with a frequency of 5 MHz. The supply field is thus "low-frequency" in the sense of one or more of the present embodiments so that the supply field is hardly able to penetrate the patient. The frequency of the received reference signal is doubled in the local coil so that the frequency corresponds to the basic clock rate or a general reference time signal of the magnetic resonance imaging system of 10 MHz. In one embodiment, a corresponding frequency-doubled signal is made available at the reference signal interface 132". The antenna 150'" for receiving the reference signal has a substantially flat first electrode 155''' and a substantially flat second electrode 158'''. Together with the capacitance of the first electrode 155''' and the capacitance of the second electrode 158''', the inductance 156''' is selected such that a defined phase displacement may be generated between the reference signal of the magnetic resonance imaging system of 90° at the reference signal interface 132. For example, this defined displacement enables the local coil 174 to be fully synchronized with the basic clock rate of the magnetic resonance imaging system.

In addition, the receiving mechanism 130" has the two antennas 150a" and 150b" for energy supply of the local coil 174. The two antennas 150a" and 150b" are arranged such that the two antennas 150a" and 150b" include a common first electrode 155". In addition to the common first electrode 155", each of the antennas also has the components of an oscillating circuit coil 156a" or 156b" and a rectifier 157a" or 157b". Outputs of the rectifier 157a" or 157b" are connected to each other with a coupling component 160, which is only shown schematically, such that voltages taken from the supply field contribute to a common supply current. This may be taken at an energy interface 131" of the receiving mechanism 130" and supplied to the magnetic resonance local coil 174.

The respective second electrodes 158a" and 158b" define differently oriented field axes with respect to the first electrode 155" so that, whatever the arrangement of the local coil on the object under investigation, in each case a sufficient energy extraction from the supply field may be provided. "Antenna diversity" (e.g., the reception of the supply field via antennas oriented differently to each other) is achieved thereby.

FIG. 5 shows the receiving mechanism 130" and the local coil 174 as separate parts. The receiving mechanism 130" may also be integrated in the local coil 174 or arranged with the local coil 174 in a common housing.

The supply fields provided for the energy supply and/or for the transmission of a reference signal may only make a small part contribution to the overall permitted patient heating. In the case of the magnetic radio-frequency fields used for the magnetic resonance imaging, the greatest heating takes place in highly conductive tissue. In contrast, with the supply field according to one or more of the present embodiments, a current density is injected, and the greatest local power density (e.g., the value of the power density corresponding to the specific absorption rate) occurs close to the surface of the object under investigation in more poorly conductive skin and fat layers of a patient. With a field strength of 1 kV/m and a frequency of the supply field of 5 MHz, the displacement current density between the field sink and the field source is, for example, $J/\sigma=\omega\in E=0.28$ $A/m^2$. A resultant power density $J^2/\sigma$ in fatty tissue (the conductivity thereof σ being approximately 0.04 S/m) is then approximately 2 $W/m^3$ corresponding to 0.002 W/kg. The heating resulting from this low power density is reliably negligible compared to a typically permissible value of 10 W/kg. The incoming current density on the back of a patient is in accordance with the smaller surface about three times greater, which results in an approximately nine-times greater power density of 0.018 W/kg. However, this is still very low.

Figure 6:
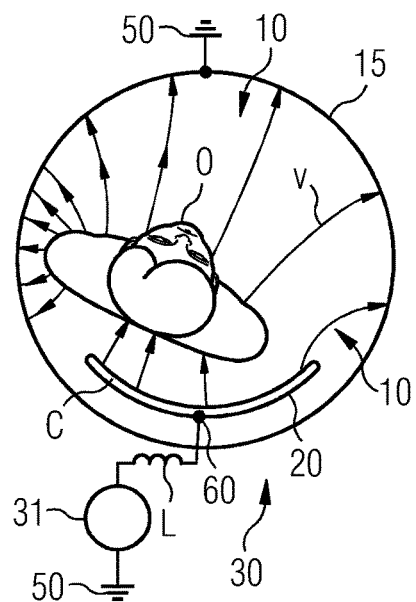
FIG. 6 shows the influence of a position change of an object under investigation on the course of a supply field.

As shown in FIG. 6, the possibility of body parts of the patient O lying closer to the bore wall 15 or even coming into contact therewith may not be excluded. The voltage of, for example, 200 V applied between the field source 50 and field sink 60 may result in an increased current density caused by electric fields. If the distance to the bore wall of, for example, 20 cm is, for example, reduced to 1 cm, the current density at this location would rise by a factor of 20, and the local specific absorption rate would rise by a factor of 400 to 0.8 W/kg. A marked part of the locally permissible SAR budget would thus be used up.

If the patient O approaches the bore wall 15, an attempt may be made to reduce the transmission voltage of the supply field V. A corresponding regulation circuit is formed by a reactive impedance having a coil L and a capacitor C. The capacitance of the capacitor C formed between regions of the bore wall 15 and regions of the patient table 20 may be changed by the position of the patient in the patient tunnel 10 so that the impedance of the image resistance is varied. This change to the impedance enables the transmission voltage to be regulated.

FIG. 7 shows an exemplary embodiment with a transmitting mechanism 30' that is embodied, in dependence on the position of the patient O in the magnetic resonance imaging system, to change the field strength of the supply field V (or the transmission voltage and hence indirectly also the transmission power). Surface current density on the surface of the patient tunnel 15' may be limited. Electrode segments 15a to 15h that form a surface 15' of the patient tunnel divided into small subareas are shown. The transmitting mechanism 30' has a field source 50 with a plurality of electrode segments 15a to 15h. In addition, the field sink 60 may also be segmented (e.g., the field sink 60 also has a plurality of small subareas that serve as electrode segments 20a to 20d of the field sink 60). The current in each of the subareas of the field source 50 or the field sink 60 is limited separately and in dependence on the position of the object under investigation O in the magnetic resonance imaging system or the patient tunnel 10. The field strength of the supply field may thus be made spatially uniform by varying the voltage of a plurality of subfields (with respect to the surface of the patient). The corresponding transmission field strength for the generation of the subfields will hereinafter be designated the segment field strength.

To vary the segment field strength, each subarea is provided with a small resonance coil L1, L2. The subareas of the patient tunnel and the bed 20 (e.g., the field source 50 and the field sink 60) in each case form with respect to each other electrode surfaces CP1, CP2 of a capacitor-like arrangement. During a magnetic resonance examination of an object under investigation O, the latter is arranged almost as a dielectric between the electrode surfaces of the capacitor. The small resonance coils L1, L2 and the subarea capacitances are brought into resonance so that the small resonance coils L1, L2 and the subarea capacitances form an LC series circuit that is in resonance if no object under investigation O is located in the patient tunnel 10 of the magnetic resonance imaging system or if no object under investigation O is arranged between the subareas or electrode segments 15a to 15h and 20a to 20d.

The LC circuits each form a reactive impedance for alternating currents that is zero at resonance. On nearing the patient, the capacitance increases. As a result, the resonance frequency is lower, and an inductive reactive impedance remains, which enables the segment field strength to become smaller. The effect of the resonance circuits transforms a voltage that transforms an excitation that is the same for all segments into an injected current. Therefore, the segment voltages are established evenly so that approximately the same current density is emitted from the wall overall. This alternating current may be used to regulate or control a transmission field strength of the transmitting mechanism 30' in dependence on the position of the object under investigation O. As shown in FIG. 7, on nearing the object under investigation O, the reactive impedance, which is assigned to a supply segment 25 including an electrode segment 20d and resonance coil, may be increased at the electrode segment 15a to 15h and 20a to 20d by detuning the LC circuit.

A position-dependent (e.g., dependent upon the position of the object under investigation O) segment field strength PSa to PSh may thus be assigned to each supply segment 25. An individual segment field strength PSa to PSh that injects an approximately homogeneous current density on the surface of the object under investigation O may thus be adjusted or regulated.

Alternatively, an independent separately controllable transmitting mechanism (e.g., a voltage source) may be used for each segment. In this case, for example, the patient bed may be grounded.

One or more of the present embodiments provide effective possibilities in order to use wirelessly operated local coils even in patients with active implants.

In addition to the described and normal components for the reception or generation of magnetic resonance signals, the local coil may also, for example, include an energy store that may be supplied with energy with the aid of the receiving mechanism. In addition, the energy supply or also the transmission of a reference signal or other signals may take place in a time multiplex method (e.g., the transmission of the signals or energy takes place if no magnetic resonance signals are generated or received with the aid of the local coil).

The magnetic resonance imaging system or local coil described above in detail only involves exemplary embodiments that may be modified by the person skilled in the art in the most varied of ways, without departing from the scope of the invention. For example, the features of all the exemplary embodiments or developments disclosed in figures may be used in any combination. The use of the indefinite article "a" or "an" does not exclude the possibility that the relevant features may also be present on a multiple basis. Similarly, the term "unit" does not preclude the possibility that the components in question may include a plurality of part-components that may optionally also be spatially distributed.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A local coil for a magnetic resonance imaging system for acquisition of magnetic resonance signals, the local coil comprising:

an antenna configured, due to an electric potential difference of a supply field present in a region of the local coil, to generate a current flow; and a receiving mechanism for wireless transmission of operating energy of the local coil or the operating energy and a signal of the magnetic resonance imaging system, wherein the receiving mechanism is operable to take the operating energy or the operating energy and the signal of the magnetic resonance imaging system from the supply field configured as an electrical alternating field between a field source and a field sink, and wherein the receiving mechanism is configured such that the operating energy of the local coil or the operating energy and the signal of the magnetic resonance imaging system is taken from the current flow.

2. The local coil as claimed in claim 1, wherein the antenna comprises an arrangement with a substantially flat first electrode and a second electrode, and wherein the first electrode and the second electrode are arranged spaced apart from each other.

3. The local coil as claimed in claim 2, wherein, when the local coil is arranged in the supply field, the first electrode and the second electrode are substantially spaced apart in a direction of the supply field, wherein the spacing between the first electrode and the second electrode defines a field axis and, when the local coil is operated, the field axis extends substantially transversely.

4. The local coil as claimed in claim 3, wherein when the local coil is operated as prescribed, the field axis extends at an angle of between 45° and 135° to a closest surface of the local coil facing an object under investigation.

5. The local coil as claimed in claim 1, wherein the receiving mechanism comprises an antenna with a plurality of antenna elements, and wherein, when the local coil is in operation, magnetic resonance signals are acquirable with the aid of an antenna element of the plurality of antenna elements.

6. The local coil as claimed in claim 1, wherein the receiving mechanism comprises a plurality of antennas, and wherein a common, substantially flat, first electrode is used for the plurality of antennas.

7. The local coil as claimed in claim 1, wherein the receiving mechanism comprises an impedance-matching mechanism.

8. The local coil as claimed in claim 1, wherein the antenna comprises an impedance-matching mechanism.

9. A magnetic resonance imaging system comprising:

a transmitting mechanism for wireless transmission of operating energy of a local coil or the operating energy and a signal of the magnetic resonance imaging system, wherein the transmitting mechanism comprises a transmission signal generator that is connected to a field source and a field sink, wherein the transmitting mechanism is configured such that, in operation, the operating energy or the operating energy and the signal of the magnetic resonance imaging system are transmitted by a current flow generated due to an electric potential difference of a supply field that is present as an electrical alternating field between the field source and the field sink.

10. The magnetic resonance imaging system as claimed in claim 9, wherein the transmitting mechanism is configured to vary a transmission field strength, transmission voltage, transmission power, transmission current, or a combination thereof in dependence on a position of an object under investigation.

11. The magnetic resonance imaging system as claimed in claim 9, wherein one field electrode, which, in operation, forms the field source or the field sink, is arranged in a region of a patient tunnel of the magnetic resonance imaging system, and a further field electrode, which, in operation, forms the field sink or the field source, is substantially arranged in a region of a patient table.

12. The magnetic resonance imaging system as claimed in claim 9, wherein the field source, the field sink, or the field source and the field sink comprise a plurality of electrode segments that are wired such that the plurality of electrode segments are adjustable to transmit the supply field with an individual segment field strength.

13. The magnetic resonance imaging system as claimed in claim 12, wherein, to adjust the individual segment field strength for each electrode segment of the plurality of electrode segments, the magnetic resonance imaging system has an individually adjustable current limiting resistor for each of the electrode segments.

14. The magnetic resonance imaging system as claimed in claim 9, further comprising, with the aid of an electrode segment, a tunable LC circuit,
wherein the tuning of the LC circuit is performable with an acquisition of a position of an object under investigation.

15. The magnetic resonance imaging system as claimed in claim 9, further comprising a local coil, the local coil comprising:
a receiving mechanism for wireless transmission of the operating energy of the local coil, the signal of the magnetic resonance imaging system, or the operating energy and the signal,
wherein the receiving mechanism is operable to take the operating energy, the signal, or the operating energy and the signal from the supply field.

16. The magnetic resonance imaging system as claimed in claim 10, wherein one field electrode, which, in operation, forms the field source or the field sink, is arranged in a region of a patient tunnel of the magnetic resonance imaging system, and a further field electrode, which, in operation, forms the field sink or the field source, is substantially arranged in a region of a patient table.

17. The magnetic resonance imaging system as claimed in claim 10, wherein the field source, the field sink, or the field source and the field sink comprise a plurality of electrode segments that are wired such that the plurality of electrode segments are adjustable to transmit the supply field with an individual segment field strength.

18. The magnetic resonance imaging system as claimed in claim 10, further comprising, with the aid of an electrode segment, a tunable LC circuit,
wherein the tuning of the LC circuit is performable with an acquisition of a position of an object under investigation.

19. A method for transmission of operating energy or the operating energy and a signal by a supply field, to a local coil of a magnetic resonance imaging system, the method comprising:
connecting the supply field as an electrical alternating voltage field between a field source and a field sink of the magnetic resonance imaging system, and taking the operating energy or the operating energy and the signal from a current flow generated due to an electric potential difference of the supply field.

* * * * *